United States Patent [19]
Umberger et al.

[11] Patent Number: 5,532,498
[45] Date of Patent: Jul. 2, 1996

[54] HIGH SENSITIVITY CONTROL CIRCUIT FOR OPTICAL SOLID-STATE RELAYS

[75] Inventors: Dean M. Umberger, Stouchsburg; Craig B. Ziemer, New Holland, both of Pa.

[73] Assignee: AT&T Corp., Murray Hill, N.J.

[21] Appl. No.: 350,342

[22] Filed: Dec. 6, 1994

[51] Int. Cl.$^6$ .................................................... G02B 27/00
[52] U.S. Cl. ..................... 250/551; 250/214 LS; 307/117
[58] Field of Search ................................. 250/551, 204, 250/205, 214 S, 214 SW, 222.2, 552, 553; 327/514–516, 520; 307/116, 117

[56] References Cited

U.S. PATENT DOCUMENTS

| | | |
|---|---|---|
| 3,723,769 | 3/1973 | Collins . |
| 3,748,481 | 7/1973 | Wagnener ............................ 250/214 R |
| 4,390,790 | 6/1983 | Rodriquez ............................ 250/551 |
| 4,408,131 | 10/1983 | Fox . |
| 4,413,193 | 11/1983 | Crockett . |
| 4,521,693 | 6/1985 | Johnson . |
| 4,777,387 | 10/1988 | Collins . |
| 4,864,126 | 9/1989 | Walters et al. ............................ 250/551 |
| 4,902,901 | 2/1990 | Pernyeszi ............................ 327/515 |
| 4,924,343 | 5/1990 | Niemi . |
| 4,931,656 | 6/1990 | Ehalt et al. ............................ 250/551 |
| 5,045,709 | 9/1991 | Ogawa ............................ 250/551 |
| 5,162,682 | 11/1992 | Lu . |
| 5,298,817 | 3/1994 | Banak et al. ............................ 327/514 |

*Primary Examiner*—Que T. Le

[57] ABSTRACT

A high sensitivity control circuit for a solid-state relay is disclosed for use in optically coupled solid state relay circuits having a light emitting diode. The control circuit reduces a loading effect of the turn-off circuit on a photodiode array allowing the photodiode array to operate the switching transistor to switch an input signal to a switching contact. A two stage CMOS transistor circuit acting as an amplifier is employed for high-speed switching. Deactivation of the light emitting diode reverse biases a sense photodiode to discharge the switching transistor to prevent switching of the input signal to the switching contact.

12 Claims, 3 Drawing Sheets

HIGH SENSITIVITY CONTROL CIRCUIT FOR OPTICAL SOLID-STATE RELAYS

BACKGROUND OF THE INVENTION

1. Field of the Invention

This disclosure relates to solid state relays, and in particular to a control circuit for an optically-coupled solid state relay.

2. Description of the Related Art

Optically-coupled solid-state relays (SSR) are applied to perform switching in telecommunication, battery powered devices, programmable controllers, electronic instruments, and industrial controls, such as microprocessor control of solenoids, lights, motors, etc. Such SSRs may replace electromechanical relays to provide improved switching speeds and reliability of operation.

Many control circuits for optically-coupled SSRs require a photodiode array (PDA) to charge not only the gate capacitance of an output transistor but also to bias a turn-off circuit in an OFF state. Because of the limited current available from the PDA, such charging of the output transistor is relatively slow and therefore reduces switch speed. In addition, large turn-on currents (on the order of mA) are generally required to bias the turn-off circuit in an OFF state.

SUMMARY

A high sensitivity control circuit for controlling optically-coupled solid-state relays is disclosed. The control circuit includes a photodiode array operatively optically coupled to a light emitting diode (LED) for generating an operating signal; a switching transistor for receiving the operating signal; and a two stage transistor circuit which responds to activation of the photodiode array by the light emitting diode for reducing the loading effect of the transistor circuit on the photodiode array to allow the photodiode array to operate the switching transistor using the operating signal to switch the signal to a switching contact. The switching transistor and the transistor circuit are metal oxide semiconductor (MOS) field effect transistors (FET), such as complementary MOS (CMOS) devices for high-speed switching. The photodiode array includes a sense photodiode for controlling the transistor circuit. Deactivation of the light emitting diode reverse biases the sense photodiode which activates the transistor circuit; and the activated transistor circuit discharges the switching transistor to prevent switching of the operating signal to the switching contact.

The disclosed control circuit uses CMOS elements, operates with significantly lower LED turn-on currents, and provides faster switching speeds. The disclosed control circuit avoids loading of the PDA to support low LED turn-on currents. In addition, because the PDA current is used only to charge the output gate capacitance, the turn-on time $t_{ON}$ is also improved. The disclosed high sensitivity control circuit operates with very low LED turn-on current by allowing the PDA to directly bias the gate of the switching transistor, with no other loading of the PDA.

Fast turn-off time $t_{OFF}$ is achieved by using low voltage CMOS and by using a sensing photodiode in the turn-off circuit, effectively isolating the circuit from the slow-responding PDA.

BRIEF DESCRIPTION OF THE DRAWINGS

The features of the disclosed solid-state relay and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 1:
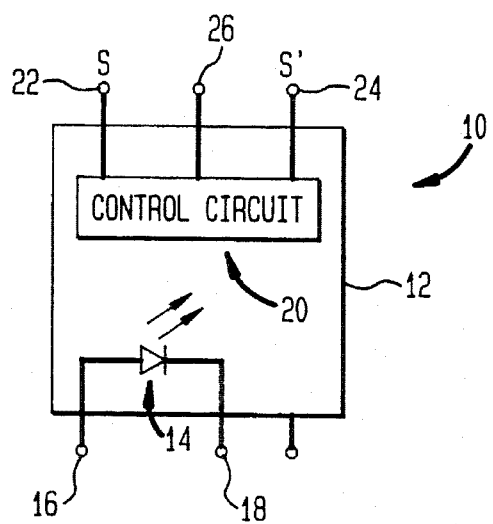
FIG. 1 is a block diagram of the disclosed solid-state relay.

Referring now in specific detail to the drawings, with like reference numerals identifying similar or identical elements, as shown in FIG. 1, the present disclosure relates to a solid state relay 10 having high operating sensitivity for low LED turn-on currents. In an exemplary embodiment, the SSR 10 is a single pole, single throw (SPST) switch, which may be housed in a dual in-line package (DIP) 12. A light emitting diode (LED) 14, such as a GaAlAs LED, is connected between a first drive contact 16 and a second drive contact 18, with a drive current applied to either of drive contacts 16, 18 to activate the LED 14 to control the switching of the SSR 10. Drive contacts 16, 18 may be associated with Pins 1, 2, respectively, of the DIP 12.

Figure 2:
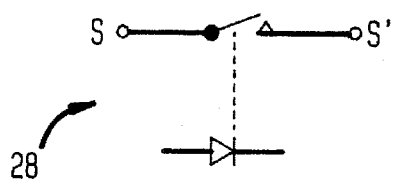
FIG. 2 is a symbolic representation of the SSR of FIG. 1.

As shown in FIG. 1, the SSR 10 includes a control circuit 20 connected to switch contacts 22–26 and is optically coupled to the LED 14. Switch contacts 22 and 24 may be associated with Pins 4 and 6, respectively, and switch contact 26 may be associated with Pin 5 of the DIP 12. In an exemplary embodiment, the SSR 10 has switch contacts 22, 24 labelled as S and S', respectively, which are electrically connected to each other by a conductive path upon activation of the SSR 10 by activation of the LED 14 through drive contacts 16, 18. Such an exemplary embodiment is shown symbolically as relay 28 in FIG. 2.

Figure 3:
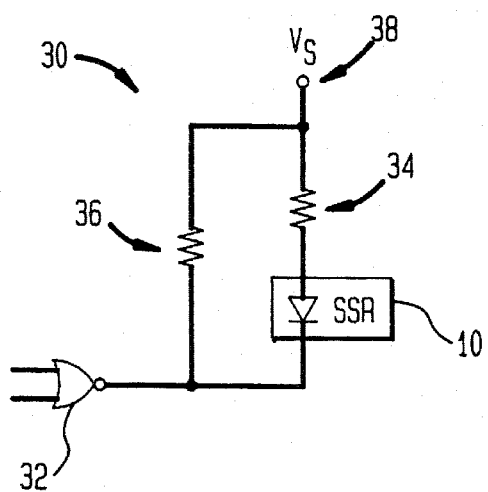
FIG. 3 is a schematic illustrating an application of the SSR of FIG. 1.

FIG. 3 is a schematic illustrating an exemplary application of the SSR 10 of FIG. 1, where a logic circuit 32, in conjunction with resistors 34, 36 and voltage source 38 labelled $V_s$, provides drive current to drive contacts 22, 24 of the SSR 10. The logic circuit 32 may be a transistor-transistor logic (TTL) gate or a buffered CMOS logic gate.

In this example, resistor 34 has a resistance of 2700 Ω and limits the amount of current flowing through the LED 14 of SSR 10. For 5 V operations, i.e. $V_s \approx 5$ V, the resistor 34 limits the drive current of the SSR 10 to about 1.4 mA. High-speed actuation of the SSR 10 may be attained by providing a lower resistor value for resistor 34.

Resistor 36 is an optional pull-up resistor which pulls the logic level high output $V_{OH}$ up toward the $V_s$ potential, and the value of the resistor 36 is to be set to a relatively high value to minimize the overall current drawn from the voltage source 38. This resistor 36 maintains the differential voltage across the LED 14 of the SSR 10 below the turn-on threshold of the LED 14 in the presence of undesirable current leakage of logic gate 32. With the logic gate 32 providing a high logic value, leakage current flows through resistor 36. For example, for a resistor 36 having a resistance of 100 kΩ, the resistor 36 draws up to 8 µA before attaining a voltage potential that may turn on the LED 14 of the SSR 10.

Figure 4:
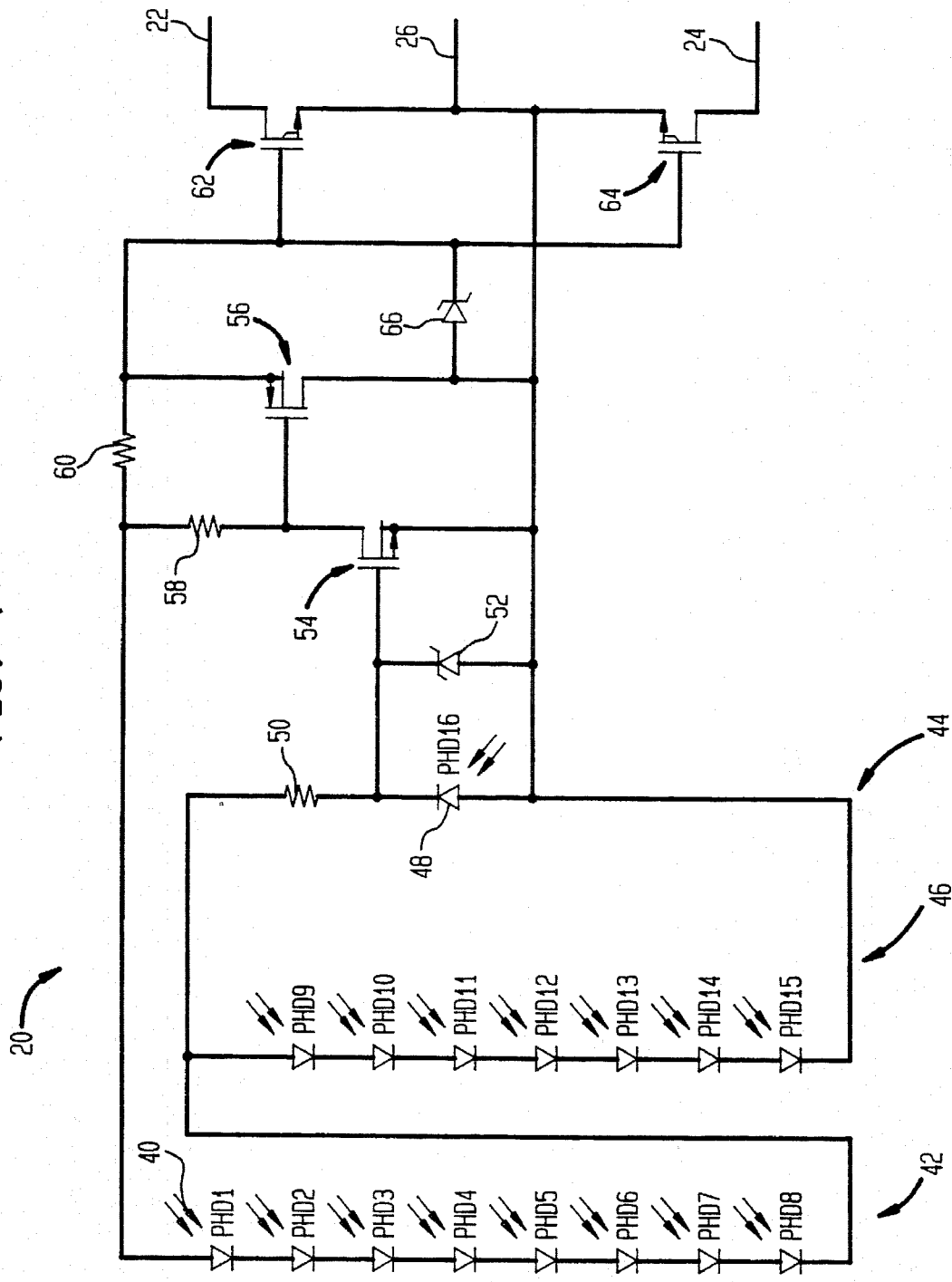
FIG. 4 is a schematic of a control circuit of the disclosed SSR of FIG. 1.

Referring to FIG. 4, the control circuit 20 is operatively optically coupled to the LED 14 by optical energy 40. The control circuit 20 includes a first photodiode array (PDA) 42 having a series of photodiodes (PHD) labelled PHD1–PHD8 and operating as photodetectors, and a second photodiode array 44 having a series 46 of photodiodes PHD9–PHD15 and having a sense photodiode 48 labelled PHD16. In the exemplary embodiment, the sense photodiode 48 is a corner photodiode of the second photodiode array 44.

The first PDA 42 is connected to the loop of the series 46 of photodiodes, the resistor 50, and the sense photodiode 48. Each of the first PDA 42 and the second PDA 44 is operatively optically coupled to the LED 14 for illumination upon activation of the LED 14.

In an exemplary embodiment, the resistor 50 is approximately a 30 MΩ resistor, which is relatively large to compensate for worst-case processing and high temperature. Otherwise, such situations may decrease the resistance of resistor 50, causing a loading down of PDA 44, which may turn off the SSR 10 prematurely. One skilled in the art would recognize that alternative resistance values and configurations of resistor 50 in the PDAs 42, 44 may be included to adjust the light sensitivity of the PDAs 42, 44, and thus to determine the turn-on current $I_{FON}$ of LED 14.

The second PDA 44 and the resistor 50 are connected to a Zener diode 52, with each of the sense photodiode 48 and the Zener diode 52 connected between the gate and the source of a negative MOSFET 54, which is a minimum geometry n-type MOS (NMOS) to ensure fast switching. The drain of the MOSFET 54 is connected to the gate of a positive MOSFET 56, which is a p-type MOS (PMOS) and to a resistor 58. The resistor 58 is also connected to the first PDA 42 and to a resistor 60. In an exemplary embodiment, the resistance of resistor 60 is about 1 MΩ. Alternative resistance values of resistor 60 may be used to increase the turn-on time $t_{ON}$ for specific applications of the SSR 10. The resistor 60 is connected to the source of the MOSFET 56, the gate of a n-type power MOSFET 62, the gate of a n-type power MOSFET 64, and a Zener diode 66. As shown in FIG. 4, the Zener diode 66 is further connected to the sense photodiode 48, the Zener diode 52, the source of MOSFET 54, the drain of the MOSFET 56, and the gates of the MOSFET 62 and MOSFET 64.

As illustrated in FIG. 4 in conjunction with FIG. 1, the drain of MOSFET 62 is connected to switch contact 22, and the drain of MOSFET 64 is connected to switch contact 24.

In an exemplary embodiment, each of the sources of MOSFETs 62, 64 is connected to the switch contact 26 shown in FIG. 1. The sources of MOSFETs 62, 64, which are connected to the second PDA 44, may also be coupled to a substrate upon which the SSR 10 is formed. During a dV/dt event such as a voltage surge, the coupling of the PDA 44 to the substrates causes the control circuit 20 to be activated such that the MOSFET 56 pulls down on the gates of the MOSFETs 62, 64 to disable the MOSFETs 62, 64 and thus to turn off the SSR 10. Thus, the SSR 10 is protected against dV/dt events.

Figure 5:
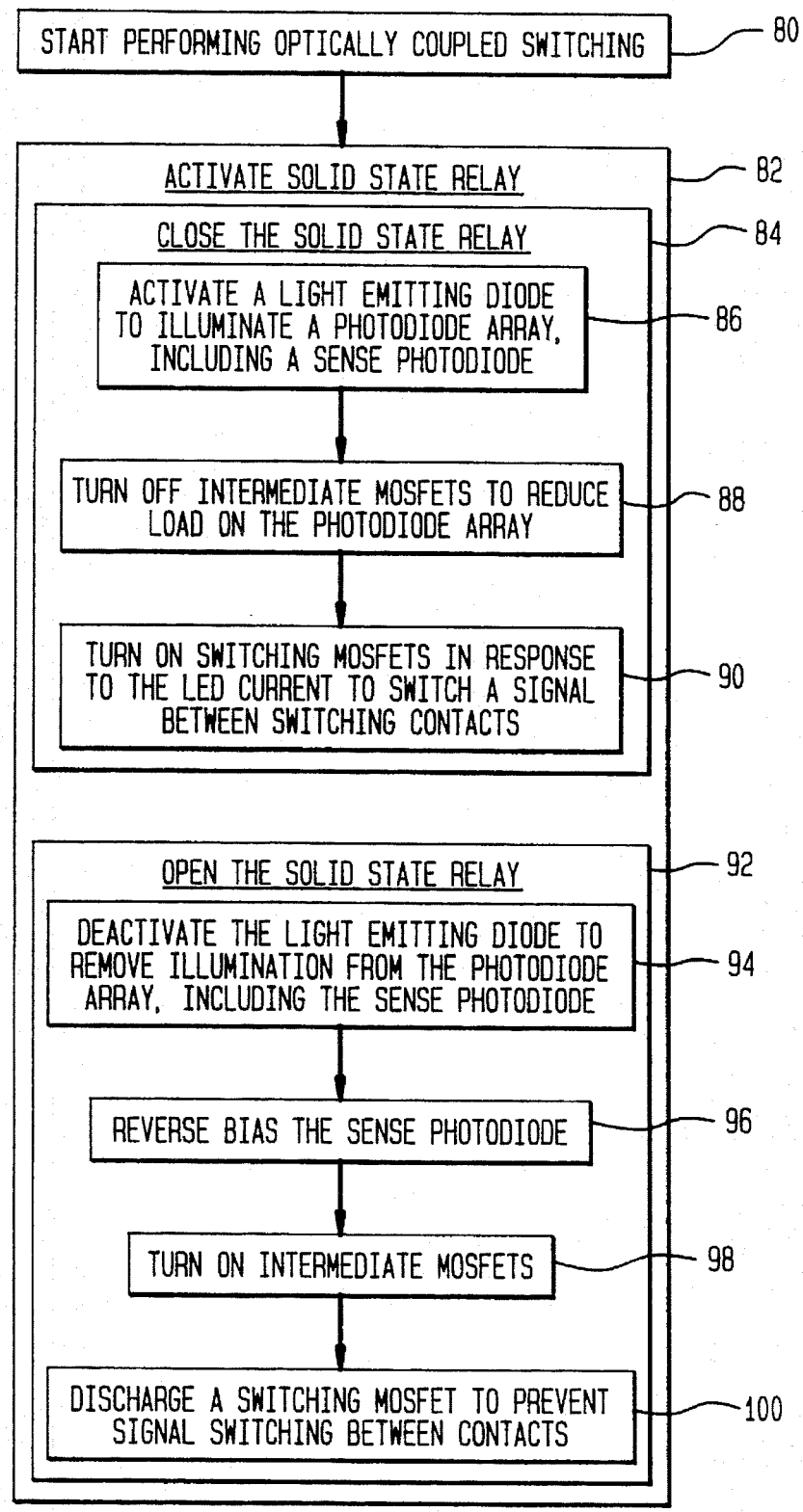
FIG. 5 illustrates a method of operation of the disclosed SSR of FIG. 1.

FIG. 5 illustrates a method of operation of the disclosed SSR of FIG. 1 by starting to perform optically coupled switching in step 80. When the SSR 10 is activated in step 82, the SSR 10 either closes in step 84 or opens in step 92 depending on the operation state of the LED 14. In step 84, when the SSR 10 is to close, the LED 14 is activated in step 86 to illuminate the PDAs 42, 44 of the control circuit 20, including the sense photodiode 48. The sense photodiode 48 is then activated, which pulls the gate of MOSFET 54 to a low state and thus to turn off MOSFET 54 in step 88. The turning off of MOSFET 54 in turn causes the MOSFET 56 to turn off as well. With MOSFETs 54, 56 turned off, the load on the photodiodes PHD1–PHD8 of PDA 42 is reduced so that the only load on PDA 42 is from the gate capacitance of the MOSFETs 62, 64. Only a very small current, such as a current being less than 100 μA, through the LED 14, is then required to cause the photodiodes of PDAs 42, 44 to generate an adequate voltage to turn on the MOSFETs 62, 64 in step 90 connected to the switch contacts 22–26 to thus switch an input signal between contacts 22–26.

Thus the control circuit 20 completely unloads the PDA 42 so relatively low turn-on currents of the LED 14 may be used to activate the SSR 10 by allowing PDA 42 to directly bias the gate of MOSFET 62, with no additional loading of the PDA 42. In addition, because nearly all of the current generated by the PDAs 42, 44 charges the gate capacitance of MOSFETs 62, 64, the turn-on time $t_{ON}$ is faster than previous solid state relays having output transistors charged by PDAs.

For opening the SSR 10 in step 92 to turn the SSR 10 off, the LED 14 is deactivated in step 94, depriving the PDAs 42, 44 of illumination. The gate capacitance of the MOSFETs 62, 64 is relatively large, which maintains the PDAs 42, 44 at approximately the same voltage. However, with no illumination, the sense photodiode 48 becomes a reverse biased diode in step 96 that pulls the gate of MOSFET 54 high through resistor 50. With MOSFET 54 activated in step 98, MOSFET 56 is then turned on in step 98.

In the exemplary embodiment, the threshold voltage of MOSFET 56 is less than the threshold voltage of MOSFET 62, so activation of MOSFET 56 discharges the gate of MOSFET 62 down to the threshold voltage of the MOSFET 56 to open the SSR 10 in step 100. Thus, very fast turn-off times $t_{OFF}$ on the order of about 100 μs may be achieved for the SSR 10. One skilled in the art would recognize that alternative values and configurations of resistor 50 in the PDAs 42, 44 may be included to adjust the turn-off time $t_{OFF}$ of SSR 10 to as low as, for example, 20 μs.

Fast switching speeds are achieved by using low voltage CMOS for components of the SSR 10 and by using the sense photodiode 48 in the control circuit 20, effectively isolating the PDAs 22, 24 from the remainder of the control circuit 20. In addition, the intermediate MOSFETs 54, 56 act as a two stage amplifier which has a gain allowing a small increase in voltage on sense photodiode 48 to cause a large decrease or discharge in gate voltage on each of MOSFETs 62, 64 to occur very rapidly.

While the disclosed high sensitivity solid state relay control circuit and method has been particularly shown and described with reference to the preferred embodiments, it will be understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. A high sensitivity control circuit for a solid-state relay having a light emitting diode for generating optical energy when activated, the control circuit comprising:

a photodiode array operatively optically coupled to the light emitting diode for generating an operating signal;

a sense photodiode operatively optically coupled to the light emitting diode and operating in a voltage generating mode in response to the optical energy from the activated light emitting diode;

a switching transistor for receiving an input signal; and a two stage transistor circuit having a first and second transistor in first and second stages, respectively, wherein the first transistor is activated when the sense photodiode is operating in the voltage generating mode and wherein the first transistor is deactivated when the sense photodiode is operating in a reverse bias mode, wherein the second transistor is activated or deactivated in response to the activation or deactivation, respectively, of the first transistor, and wherein the deactivation of the first and second transistors of the transistor circuit reduces a loading effect of the transistor circuit on the photodiode array for facilitating operation of the switching transistor using the operating signal to switch the input signal to a switching contact.

2. The high sensitivity control circuit of claim 1 wherein the switching transistor and the transistor circuit are complementary metal oxide semiconductor (CMOS) devices.

3. The high sensitivity control circuit of claim 1 wherein the photodiode array is combined with the sense photodiode for controlling the transistor circuit to reduce the loading effect.

4. The high sensitivity control circuit of claim 1 wherein the sense photodiode, responsive to deactivation of the light emitting diode, is reverse biased to activate the two stage transistor circuit by activating the first transistor; and the activated two stage transistor circuit discharges the switching transistor to prevent switching of the signal to the switching contact.

5. An optically coupled solid state relay comprising:

an activation contact;

first and second switching contacts;

a light emitting diode, responsive to an activation signal received at the activation contact, for generating light;

a two stage metal oxide semiconductor field effect transistor (MOSFET) circuit including a first transistor and a second transistor which is driven by the first transistor;

a photodiode array connected to the MOSFET circuit, the photodiode array including a sense photodiode and responsive to the light for deactivating the MOSFET circuit and for generating a drive signal, wherein the sense photodiode drives the first transistor to drive the second transistor, and wherein the sense photodiode deactivates the first transistor to deactivate the second transistor for deactivating the MOSFET circuit; and a switching MOSFET connected to the first switching contact for receiving an input signal, the switching MOSFET responsive to the deactivation of the MOSFET circuit for reducing a loading effect of the MOSFET circuit on the photodiode array, wherein the switching MOSFET is responsive to the drive signal to switch the input signal to the second switching contact.

6. The solid state relay of claim 5 wherein the MOSFET circuit and the switching MOSFET include complementary metal oxide semiconductor (CMOS) devices.

7. The solid state relay of claim 5 wherein the deactivation of the MOSFET circuit reduces the loading effect of the MOSFET circuit.

8. The solid state relay of claim 5 wherein the photodiode array generates the drive signal in response to an LED current as the activation signal less than 100 µA.

9. The solid state relay of claim 5 wherein the MOSFET circuit has an associated first threshold voltage less than a second threshold voltage associated with the switching MOSFET.

10. (Amended) A method for controlling switching of an input signal to a switching contact of a solid-state relay, the method comprising the steps of:

responding to an illumination state of a light emitting diode using a photodiode array, including a sense photodiode; and operating a MOSFET circuit, including a first transistor in a first stage and a second transistor in a second stage, corresponding to the illumination state including the steps of:

deactivating the first transistor in response to an activation of the sense photodiode; and deactivating the second transistor in response to the deactivation of the first transistor for reducing a loading effect of the MOSFET circuit on the photodiode array to control the switching of the input signal to the switching contact by a switching MOSFET.

11. The method of claim 10 wherein the steps of responding includes the steps of:

receiving light at the photodiode array from the light emitting diode; and generating a drive signal in response to the light; and the step of operating includes the steps of:

deactivating the MOSFET circuit by deactivating the first and second transistors;

reducing the load effect of the MOSFET circuit on the photodiode array in response to the deactivation of the MOSFET circuit;

operating the switching MOSFET in response to the drive signal; and switching the input signal to a switching contact to close the solid state relay.

12. The method of claim 10 wherein the step of responding includes the step of:

reverse biasing a sense photodiode in the absence of light from the light emitting diode; and the step of operating the MOSFET circuit includes the steps of:

activating the MOSFET circuit; and deactivating the switching MOSFET to prevent switching the input signal to a switching contact.

* * * * *